United States Patent
Hayashi

(10) Patent No.: US 8,556,455 B2
(45) Date of Patent: Oct. 15, 2013

(54) LIGHTING DEVICE, DISPLAY DEVICE AND TELEVISION RECEIVER

(75) Inventor: Keiji Hayashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 527 days.

(21) Appl. No.: 13/055,980

(22) PCT Filed: Jun. 8, 2009

(86) PCT No.: PCT/JP2009/060434
§ 371 (c)(1),
(2), (4) Date: Jan. 26, 2011

(87) PCT Pub. No.: WO2010/013544
PCT Pub. Date: Feb. 4, 2010

(65) Prior Publication Data
US 2011/0122341 A1    May 26, 2011

(30) Foreign Application Priority Data
Jul. 29, 2008  (JP) .................................. 2008-195169

(51) Int. Cl.
*B60Q 1/26*    (2006.01)

(52) U.S. Cl.
USPC ............................ 362/227; 362/97.3; 362/613

(58) Field of Classification Search
USPC ................... 349/65; 362/227, 613, 612, 97.3, 362/249.14, 249.06, 234, 630, 631; 40/589, 40/591, 546
See application file for complete search history.

(56) References Cited

U.S. PATENT DOCUMENTS

| 7,052,152 B2 | 5/2006 | Harbers et al. |
| 2003/0189829 A1 | 10/2003 | Shimizu et al. |
| 2005/0207165 A1 | 9/2005 | Shimizu et al. |
| 2005/0237747 A1 | 10/2005 | Shimizu et al. |

(Continued)

FOREIGN PATENT DOCUMENTS

| CN | 1464953 A | 12/2003 |
| CN | 200947143 Y | 9/2007 |

(Continued)

OTHER PUBLICATIONS

English translation of Official Communication issued in corresponding Russian Patent Application No. 2011102935, mailed on Aug. 27, 2012.

(Continued)

*Primary Examiner* — Mariceli Santiago
*Assistant Examiner* — Glenn Zimmerman
(74) *Attorney, Agent, or Firm* — Keating & Bennett, LLP

(57) ABSTRACT

A lighting device 12 of the present invention includes a plurality of point light sources 32 and a conductive pattern 34. Each of the point light sources 32 includes two electrodes 33a, 33b having different polarities, and the point light sources 32 are defined in a plurality of light source arrays 40 each including a predetermined number of point light sources 32, and driving power is supplied to each light source array 40. The adjacent light source arrays 40, 40 are arranged so that the point light source 32 of one of the adjacent light source arrays 40, 40 is opposed to the point light source 32 of another one of the adjacent light source arrays 40, 40 with each one electrode 33a, 33a being opposed to each other. The opposing electrodes 33a, 33a are arranged to have a same polarity and connected to a same conductive pattern 34.

8 Claims, 12 Drawing Sheets

(56) References Cited

U.S. PATENT DOCUMENTS

| | | |
|---|---|---|
| 2005/0242362 A1 | 11/2005 | Shimizu et al. |
| 2006/0104090 A1* | 5/2006 | Lengyel et al. ............... 362/612 |
| 2006/0160409 A1 | 7/2006 | Shimizu et al. |
| 2007/0085944 A1 | 4/2007 | Tanaka et al. |
| 2007/0187708 A1 | 8/2007 | Setomoto et al. |
| 2007/0236447 A1 | 10/2007 | Lee et al. |
| 2008/0002103 A1 | 1/2008 | Lee |
| 2008/0061716 A1 | 3/2008 | Kim et al. |
| 2008/0179602 A1* | 7/2008 | Negley et al. .................. 257/88 |
| 2009/0109668 A1 | 4/2009 | Isobe |
| 2012/0187429 A1 | 7/2012 | Isobe |

FOREIGN PATENT DOCUMENTS

| | | |
|---|---|---|
| JP | 7-64078 A | 3/1995 |
| JP | 07-064678 A | 3/1995 |
| JP | 10-039300 A | 2/1998 |
| JP | 2001-266631 A | 9/2001 |
| JP | 2005-235779 A | 9/2005 |
| JP | 2007-165161 A | 6/2007 |
| JP | 2007-305929 A | 11/2007 |
| JP | 2007-323857 A | 12/2007 |
| RU | 27878 U1 | 2/2003 |
| RU | 58249 U1 | 11/2006 |
| RU | 61054 U1 | 2/2007 |
| WO | 2007/034537 A1 | 3/2007 |

OTHER PUBLICATIONS

English translation of Official Communication issued in corresponding Russian Patent Application No. 2011102935, mailed on Apr. 28, 2012.

Official Communication issued in International Patent Application No. PCT/JP2009/060434, mailed on Aug. 18, 2009.

\* cited by examiner

LIGHTING DEVICE, DISPLAY DEVICE AND TELEVISION RECEIVER

TECHNICAL FIELD

The present invention relates to a lighting device, a display device and a television receiver.

BACKGROUND ART

A liquid crystal panel included in a liquid crystal display device of a liquid crystal display TV does not emit light, and thus a backlight device is required as a separate lighting device that supplies illumination light to the liquid crystal panel. A backlight device in which a plurality of LEDs (light emitting diodes) are arranged as light sources and they are connected in series has been known (for example, Patent Document 1).
[Patent Document 1] Japanese Unexamined Patent Publication No. 2007-305929

PROBLEM TO BE SOLVED BY THE INVENTION

In the configuration disclosed in Patent Document 1, the LEDs are connected in series. This increases the number of connection points and also a light emission amount from each LED is greatly varied. To suppress the variation of the light emission amount, it is preferable to arrange a plurality of light source arrays each of which including a predetermined number of LEDs connected in series and supply driving power to each light source array. In such a case, a conductive line for power supply is connected to one end of each light source array and a conductive line for grounding is connected to another end of each light source array. This increases the number of conductive lines and makes an electric configuration complicated.

If the light source arrays are arranged so that each one of the ends is opposed to each other, two conductive lines such as the power supply conductive line and the grounding conductive line are provided between the adjacent light source arrays. In such a case, since the two conductive lines are required to be arranged with a predetermined distance therebetween from a safety standpoint, a space is required between the adjacent light source arrays. Therefore, a space between the LEDs is great in a part where the conductive line is provided and therefore, the LEDs are not arranged evenly. The uneven arrangement of the LEDs may cause a nonuniform illumination brightness distribution.

DISCLOSURE OF THE PRESENT INVENTION

The present invention was made in view of the foregoing circumstances. An object of the present invention is to provide a display device in which light sources are arranged evenly and closely to improve illumination brightness and achieve a uniform illumination brightness distribution. Another object of the present invention is to provide a display device including such a lighting device and a television receiver including such a display device.

MEANS FOR SOLVING THE PROBLEM

To solve the above problem, a lighting device of the present invention includes a plurality of point light sources and a conductive pattern that is electrically connected to the point light sources. Each of the point light sources includes two electrodes having different polarities, and the point light sources are defined in a plurality of light source arrays each including a predetermined number of point light sources, and driving power is supplied to each light source array. The adjacent light source arrays are arranged so that the point light source of one of the adjacent light source arrays is opposed to the point light source of another one of the adjacent light source arrays with each one electrode being opposed to each other, and the opposing electrodes are arranged to have a same polarity and connected to a same conductive pattern.

With such a configuration, to connect a power supply conductive line extending from a power source, for example, to the point light source to drive it, one conductive line is connected to the conductive pattern. This supplies driving power to the adjacent two light source arrays from the one conductive line via the electrodes connected to the conductive pattern. Therefore, it is not necessary to connect the conductive line to each light source array. This reduces the number of conductive lines.

If the power supply conductive line is separately connected to each of the adjacent light source arrays that are opposed to each other, a predetermined space is required between the conductive lines from a safety standpoint. Accordingly, a space is required between the adjacent light source arrays. As a result, the LEDs are separated far from each other in an opposing part of the adjacent light source arrays. This may cause uneven illumination brightness. However, according to the present invention, one conductive line supplies driving power to the adjacent light source arrays. Therefore, no space is required between the adjacent light source arrays and the LEDs are arranged closely at equal intervals. This improves illumination brightness of the lighting device and unifies the illumination brightness distribution.

BEST MODE FOR CARRYING OUT THE INVENTION

First Embodiment

The first embodiment of the present invention will be explained with reference to FIGS. 1 to 8. A construction of a television receiver TV including a liquid crystal display device 10 will be explained.

Figure 1:
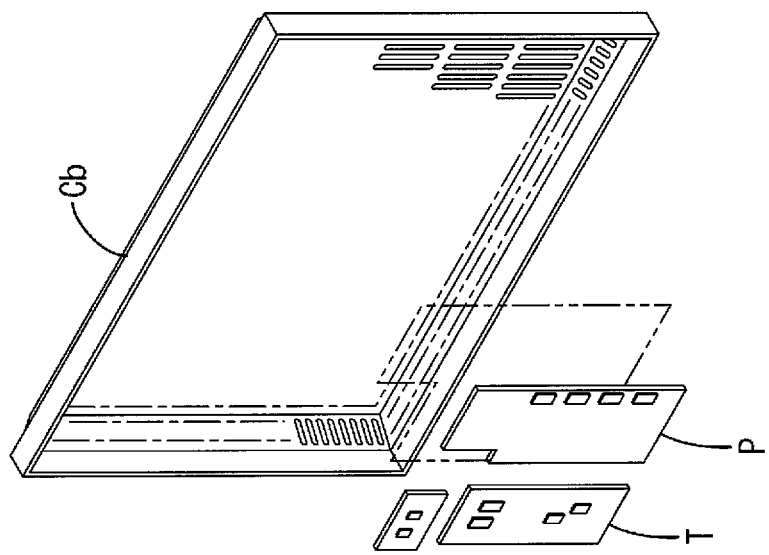
FIG. 1 is an exploded perspective view illustrating a general construction of a television receiver according to a first embodiment of the present invention.
Figure 1:
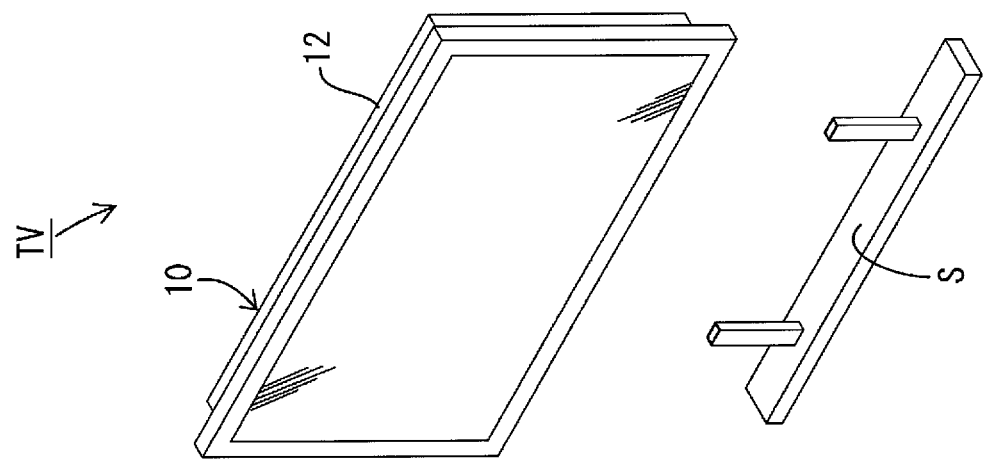
Figure 1:
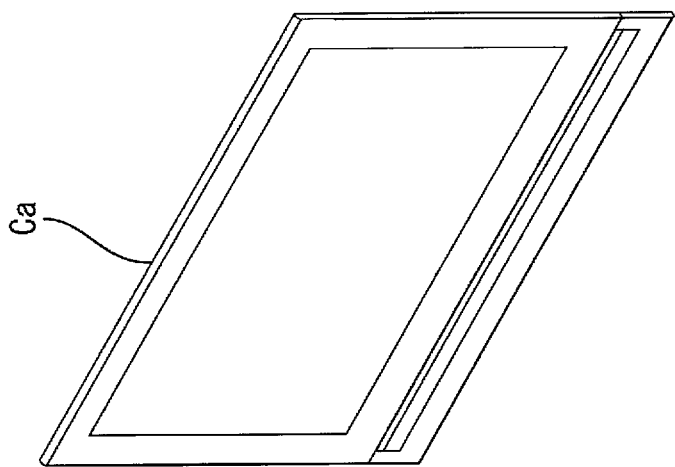
Figure 2:
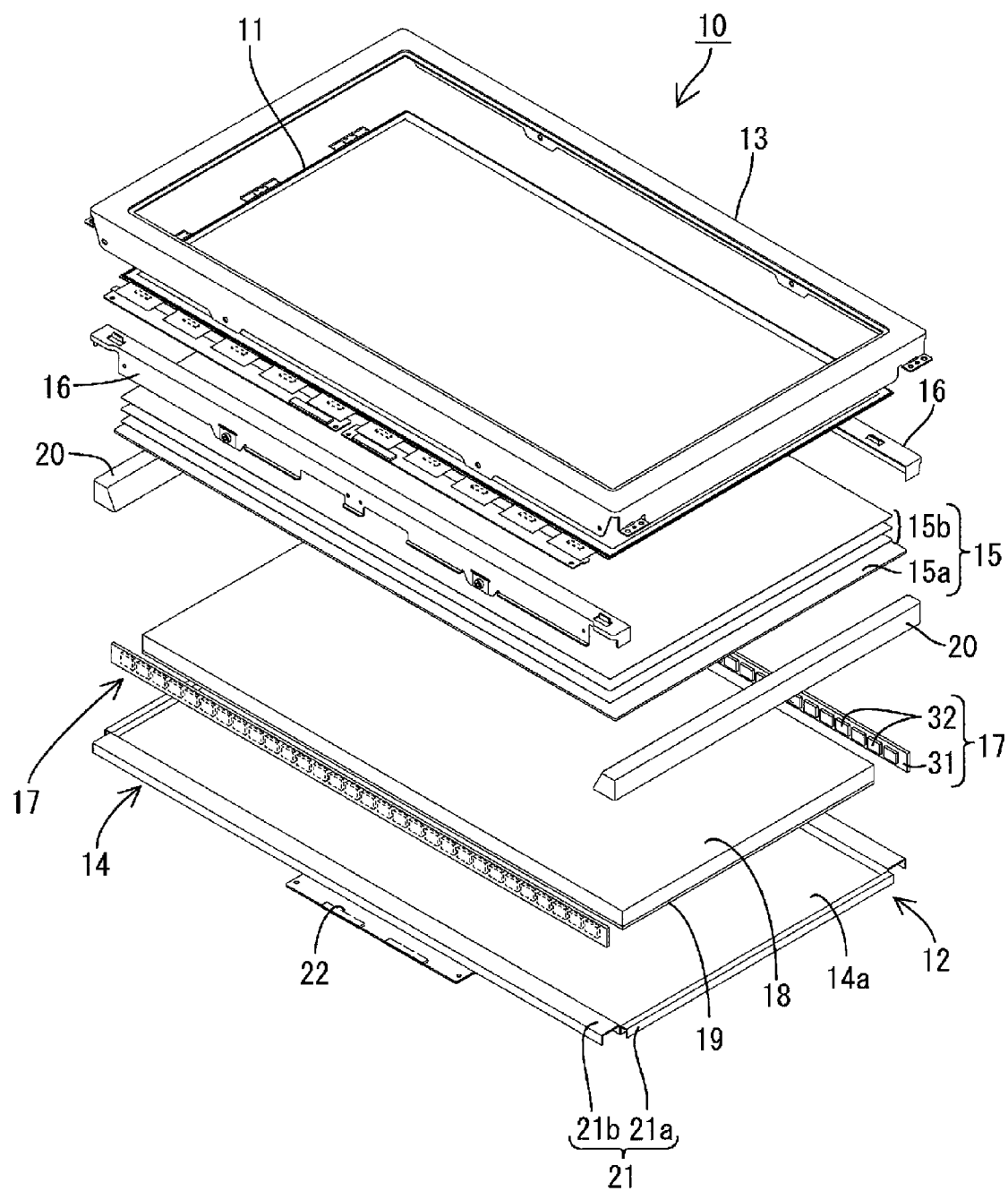
FIG. 2 is an exploded perspective view illustrating a general construction of a liquid crystal display device provided in the television receiver in FIG. 1.
Figure 3:
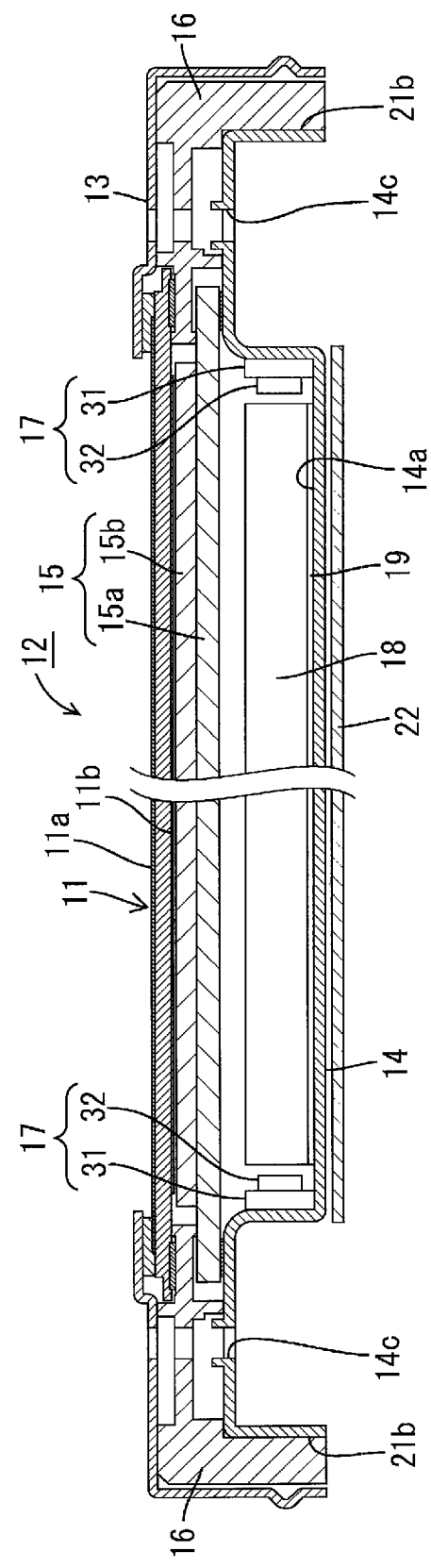
FIG. 3 is a cross-sectional view of the liquid crystal display device along the short-side direction.
Figure 4:
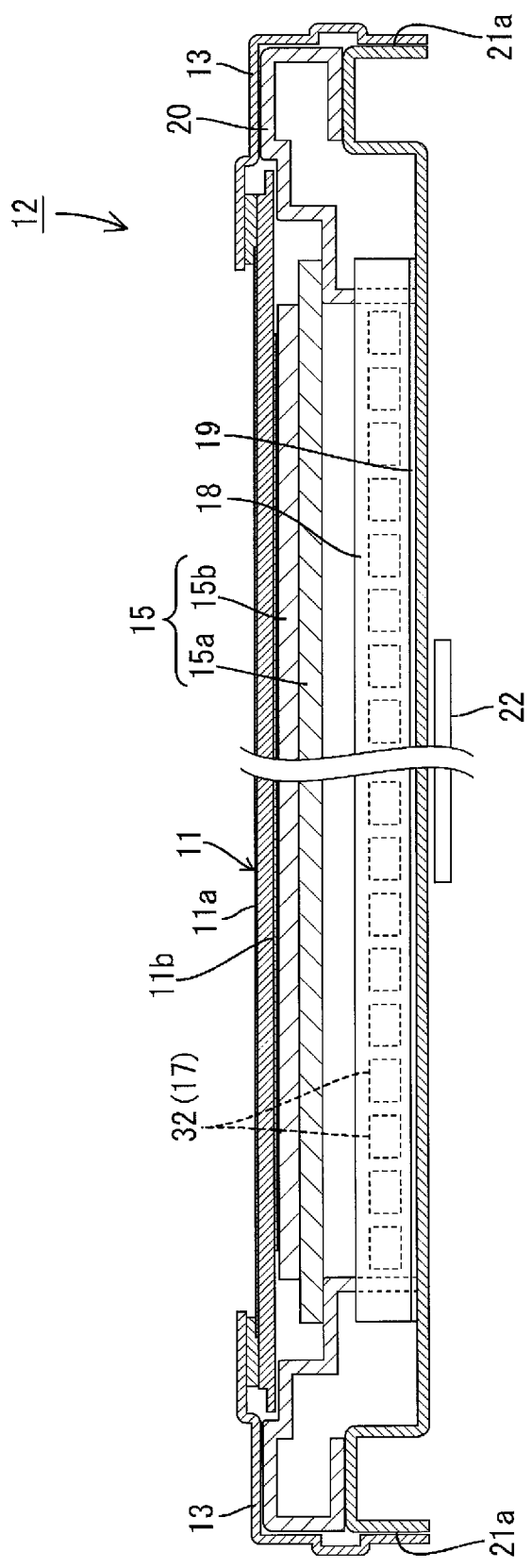
FIG. 4 is a cross-sectional view of the liquid crystal display device along the long-side direction.

FIG. 1 is an exploded perspective view illustrating a general construction of the television receiver of this embodiment. FIG. 2 is an exploded perspective view illustrating a general construction of the liquid crystal display device included in the television receiver in FIG. 1. FIG. 3 is a cross-sectional view of the liquid crystal display device in FIG. 2 along the short-side direction. FIG. 4 is a cross-sectional view of the liquid crystal display device in FIG. 2 along the long-side direction.

As illustrated in FIG. 1, the television receiver TV of the present embodiment includes the liquid crystal display device 10, front and rear cabinets Ca, Cb that house the liquid crystal display device 10 therebetween, a stand S, a power source P and a tuner T. An overall shape of the liquid crystal display device (display device) 10 is a landscape rectangular. The liquid crystal display device 10 is housed in a vertical position. As illustrated in FIG. 2, it includes a liquid crystal panel 11 as a display panel, and a backlight device 12 (lighting device), which is an external light source. They are integrally held by a bezel 13 and the like.

Next, the liquid crystal panel 11 and the backlight device 12 included in the liquid crystal display device 10 will be explained (see FIGS. 2 to 4).

The liquid crystal panel (display panel) 11 is constructed such that a pair of glass substrates is bonded together with a predetermined gap therebetween and liquid crystal is sealed between the glass substrates. On one of the glass substrates, switching components (e.g., TFTs) connected to source lines and gate lines that are perpendicular to each other, pixel electrodes connected to the switching components, and an alignment film are provided. On the other substrate, counter electrodes, color filter having color sections such as R (red), G (green) and B (blue) color sections arranged in a predetermined pattern, and an alignment film are provided. Polarizing plates 11a, 11b are attached to outer surfaces of the substrates (see FIGS. 3 and 4).

As illustrated in FIG. 2, the backlight device 12 includes a chassis 14, an optical member 15, and frames 16. The chassis 14 has a substantially box-shape and an opening on the light output side (on the liquid crystal panel 11 side). The optical member 15 is provided to cover the opening of the chassis 14. The frames 16 arranged along the long sides of the chassis 14 hold the long-side edges of the optical member 15 to the chassis 14. LED boards 17, a light guide plate 18 and holders 20 are provided in the chassis 14. Each of the LED boards 17 is provided on each of the long side edges of the chassis 14 and emits light. The light guide plate 18 is provided between the LED boards 17 and guides light emitted from the LED boards 17 to the liquid crystal panel 11. The edges of the optical member 15 are placed on the holders 20. In the edge-light type backlight device 12 of this embodiment, the light source is provided on the rim of the chassis 14.

The chassis 14 is prepared by processing a metal plate. It is formed in a substantially shallow box shape. It includes a rectangular bottom plate 14a and outer rims 21 each of which extends upright from the corresponding side of the bottom plate 14a and has a substantially U shape. The outer rims 21 include short-side outer rims 21a and long-side outer rims 21b. Fixing holes 14c are formed in an upper surface of the long-side outer rims 21 of the chassis 14 as illustrated in FIG. 3. The bezel 13, the frames 16 and chassis 14 are integrally fixed by screws that are inserted in the fixing holes 14c.

On the opening side of the chassis 14, the optical member 15 including a diffuser plate 15a and optical sheets 15b is provided. The diffuser plate 15a includes a synthetic resin plate containing scattered light diffusing particles. It diffuses linear light emitted from the LED boards 17 and guided by the light guide plate 18. The short-side edge of the diffuser plate 15a is placed on the holder 20, and does not receive a vertical force (see FIG. 4). As illustrated in FIG. 3, the long-side edges of the diffuser plate 15a are sandwiched between the chassis 14 and the frame 16.

The optical sheets 15b provided on the diffuser plate 15a include a diffuser sheet, a lens sheet and a reflecting type polarizing plate layered in this order from the diffuser plate 15a side. Light emitted from the LED boards 17 passes through the diffuser plate 15a and enters the optical sheets 15b. The optical sheets 15b are provided for converting the light to planar light. The liquid crystal display panel 11 is disposed on the top surface of the top layer of the optical sheets 15b. The optical sheets 15b are held between the diffuser plate 15a and the liquid crystal panel 11.

The LED board 17 includes a base plate 31 and LED light sources (point light sources) 32 as illustrated in FIG. 2. The base plate 31 is rectangular and formed of a resin plate. The LED light sources 32 are provided along a line. Each of the LED boards 17, 17 is fixed to the corresponding long-side outer rim 21b of the chassis 14 by a screw, for example, so that the LED light sources 32 are opposed to each other. Each of the LED light sources 32 may have three LED chips (not shown) each of which emits light of single color of R (red), G (green) and B (blue). The LED chips may be mounted on the LED light source 32 by surface mounting. A blue LED chip and a yellow phosphor may be combined to prepare the LED light source 32.

The light guide plate 18 is formed in a rectangular plate and formed of resin having high translucency (high transparency) such as acrylic. The light guide plate 18 is disposed between the opposing LED boards 17 so that its main surface faces the diffuser plate 15a as illustrated in FIG. 3. A light reflecting sheet 19 is disposed on a surface of the light guide plate 18 opposite from the surface facing the diffuser plate 15a. The light reflecting sheet 19 reflects the light penetrating through the light guide plate 18 and returns the light into the light guide plate 18. The light guide plate 18 makes the light emitting from the LED boards 17 and entering the side surfaces of the light guide plate 18 to be output from the main surface of the light guide plate 18 facing the diffuser plate 15a. Accordingly, the light is irradiated to the liquid crystal panel 11 from its rear side.

A drive circuit board 22 that controls driving of the LED light sources 32 is arranged in a middle portion of a rear surface of the bottom plate 14a of the chassis 14 (a surface of the bottom plate 14a opposite from a surface having the LED board 17). The drive circuit board 22 is formed in a rectangular shape and includes a power source PS and a control circuit and others (not shown).

Next, a configuration of the LED board 17 will be explained with reference to FIGS. 5 and 6.

Figure 5:
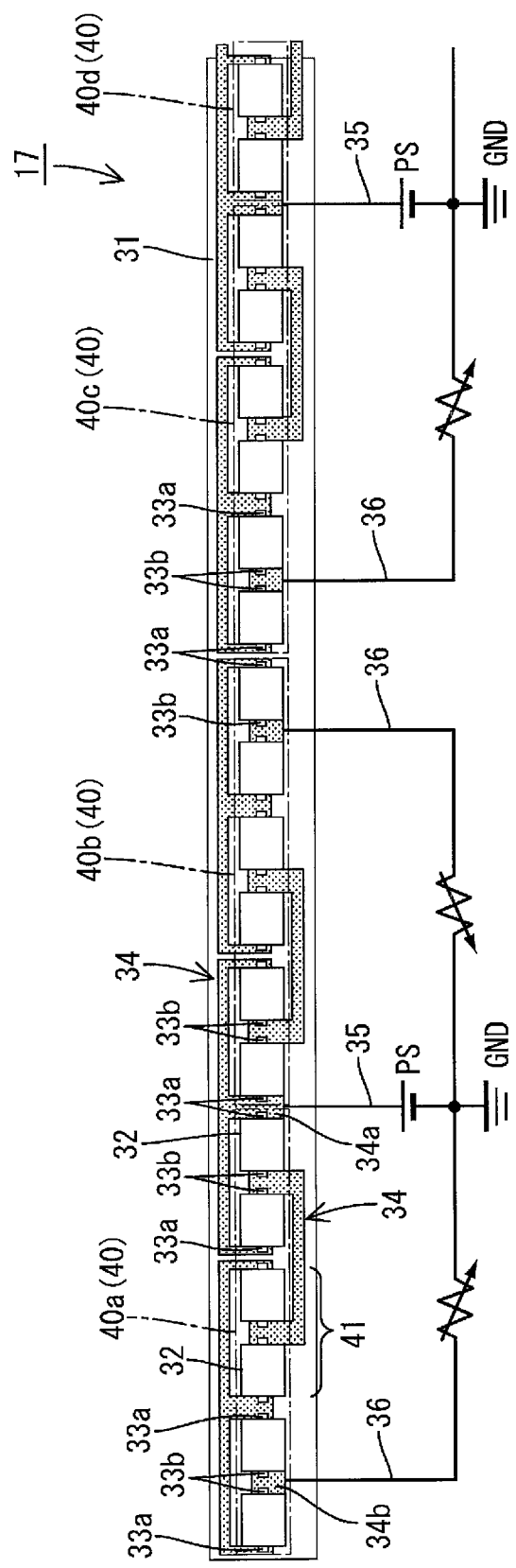
FIG. 5 is a typical view illustrating a connection configuration of LED light sources on an LED board and conductive patterns.

FIG. 5 is a typical view illustrating a connection configuration of the LED light sources on the LED board and conductive patterns. FIG. 6 is a circuit diagram illustrating a driving configuration of the LED light sources.

The LED light sources 32 are arranged in a straight line on the LED board 17 along the long-side direction of the base plate 31 as illustrated in FIG. 5. Each LED light source 32 includes an anode 33a that is an electrode to which driving power is input and a cathode 33b that is an electrode from which the driving power is output. Each of the anode 33a and the cathode 33b has a different polarity. The adjacent LED light sources 32, 32 are arranged so that the electrodes having the same polarity (the anode 33a and the anode 33a or the cathode 33b and the cathode 33b) are opposed to each other. Therefore, the anode 33a or the cathode 33b of one LED light source 32 is opposed to the anode 33a or the cathode 33b of the adjacent LED light source 32, respectively.

Conductive patterns 34 are formed on the base plate 31 by printing. The conductive pattern 34 is electrically connected to the anode 33a and the cathode 33b of each LED light source 32. Accordingly, driving power is supplied to the LED light sources 32 and the current is transferred between the LED light sources 32, 32 via the conductive patterns 34.

Six LED light sources 32 define one group according to the arrangement order to configure a light source array 40. Specifically, the LED light sources 32 form a first light source array 40a, a second light source array 40b, a third light source array 40c, a fourth light source array 40d ... sequentially from the left side in FIG. 5. Each of the light source arrays 40a, 40b, 40c, 40d ... is aligned along a line that aligns along the arrangement line of the LED light sources 32. In the present embodiment, one light source array 40 is configured by six LED light sources 32, however, the number of LED light sources 32 forming one light source array 40 may be changed.

Each LED light source 32 is configured so that driving power is supplied from the power source PS provided on the driving circuit board 22 to every light source array 40a, 40b, 40c, 40d .... The driving configuration will be explained for the first light source array 40a as an example. The anode 33a of the LED light source 32 that is positioned at the right end of the first light source array 40a (that is opposed to the second light source array 40b) is connected to the conductive pattern 34 (first conductive pattern 34a). A power supply harness 35 extending from the power source PS is connected to the first conductive pattern 34a. The driving power is supplied to the right-end LED light source 32 via the first conductive pattern 34a. Further, the driving power is supplied to another LED light sources 32 of the first light source array 40a via the conductive pattern 34 that is connected to the right-end LED light source 32.

At the left end of the first light source array 40a (at the end of the base plate 31), two LED light sources 32, 32 are arranged so that their cathodes 33b, 33b are opposed to each other. The cathodes 33b, 33b are connected to the same conductive pattern 34 (second conductive pattern 34b). A grounding harness 36 is connected to the second conductive pattern 34b. This discharges the driving power flowing in the first light source array 40a to a ground GND. Thus, the LED light sources 32 are configured so as to supply and discharge driving power for every light source array 40a, 40b, 40c, 40d ....

Figure 6:
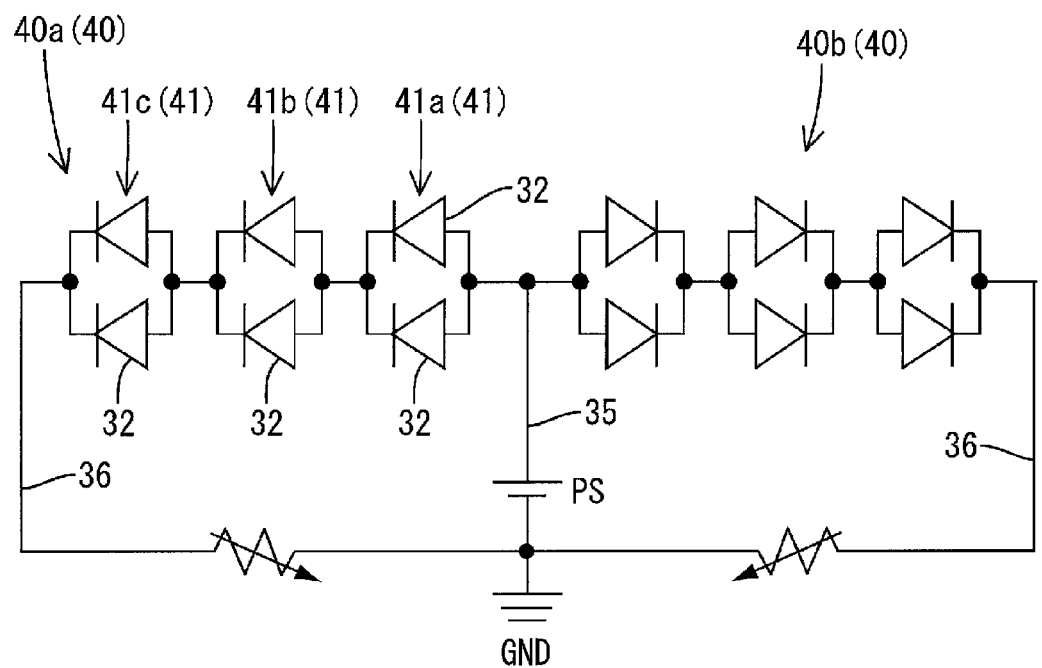
FIG. 6 is a circuit diagram illustrating a driving configuration of the LED light sources in FIG. 5.

The LED light sources 32 of the first light source array 40a are connected to each other as illustrated in FIG. 6. In the first light source array 40a, the adjacent two LED light sources 32, 32 are connected in parallel to form a light source unit 41. The light source units 41 are connected in series. Therefore, electric power input from the power supply harness 35 to the first light source array 40a is supplied to the first light source unit 41a, the second light source unit 41b, the third light source unit 41c in this order, and then, the electric power is discharged via the grounding harness 36. Such a connecting configuration of the LED light sources 32 is formed by the conductive patterns 34 illustrated in FIG. 5. However, the configuration pattern of the conductive patterns 34 is not limited to the one illustrated in FIG. 5.

The second light source array 40b adjacent to the first light source array 40a has a configuration that is mirror symmetrical about the first light source array 40a. Therefore, in the second light source array 40b, driving power is input to the LED light source 32 positioned to be opposed to the first light source array 40a and supplied to another LED light sources 32 via the conductive patterns 34. The opposing LED light sources 32 of the first light source array 40a and the second light source array 40b that are opposed to each other are arranged so that the corresponding anodes 33a, 33a are opposed to each other.

The third light source array 40c adjacent to the second light source array 40b has a configuration that is mirror symmetrical about the second light source array 40b. The fourth light source array 40d has a configuration that is mirror symmetrical about the third light source array 40c. That is, the configuration of the third light source array 40c and the fourth light source array 40d is same as that of the first light source array 40a and the second light source array 40b respectively. In other words, the connecting pattern of the first light source array 40a and the second light source array 40b is repeated on the LED board 17.

Next, operational effects of the present embodiment will be explained with reference to FIGS. 7 to 10.

Figure 7:
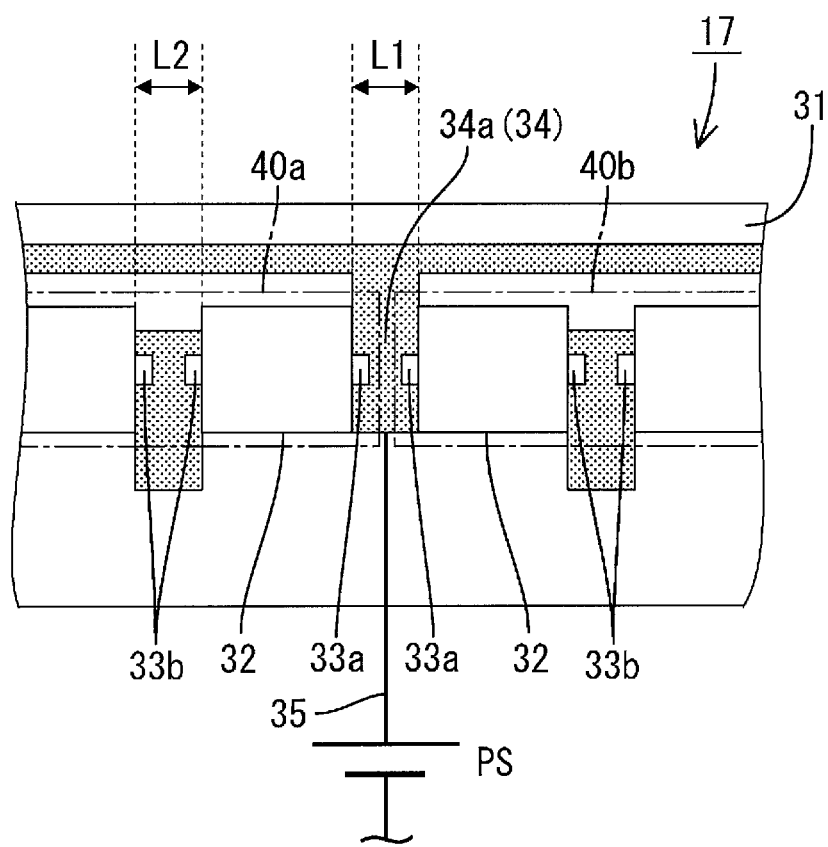
FIG. 7 is an enlarged typical view illustrating a configuration between a first light source array and a second light source array.
Figure 8:
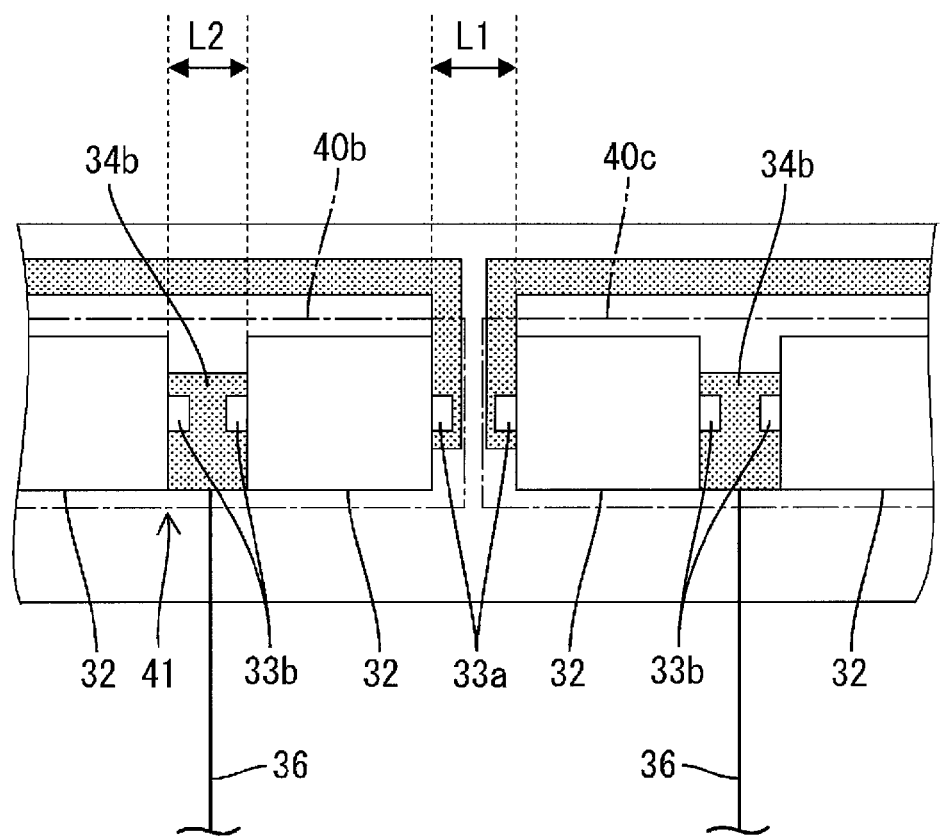
FIG. 8 is an enlarged typical view illustrating a configuration between the second light source array and a third light source array.
Figure 9:
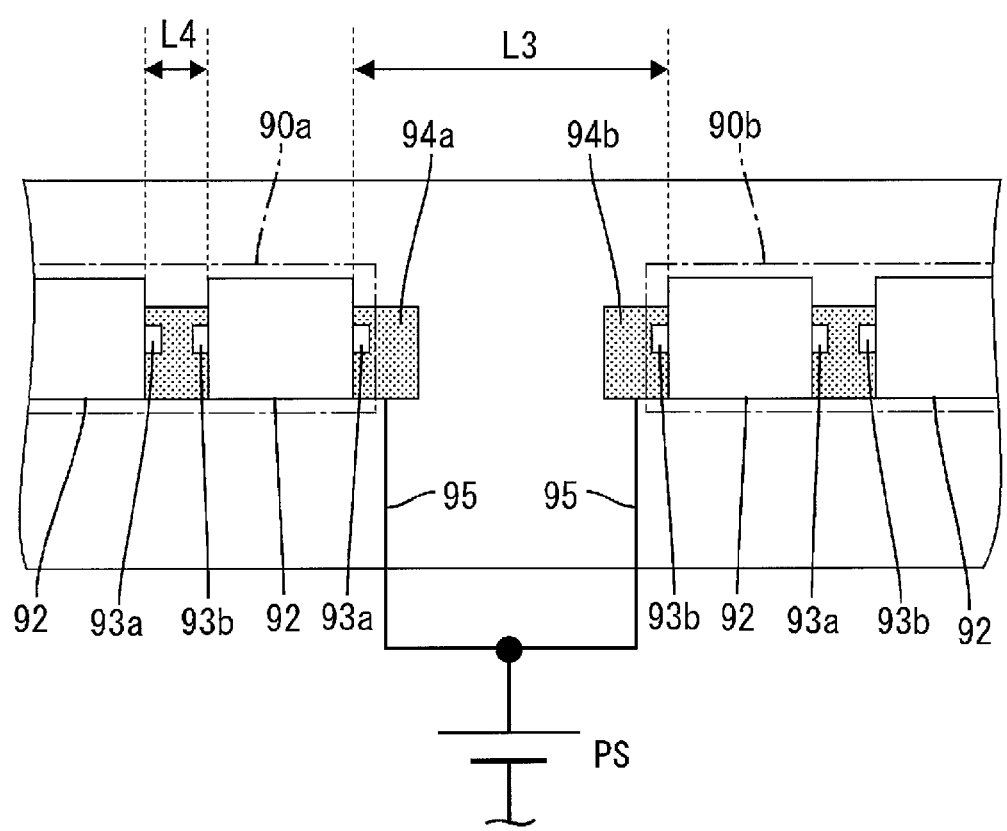
FIG. 9 is an enlarged typical view illustrating a configuration between a first light source array and a second light source array according to a comparative example.
Figure 10:
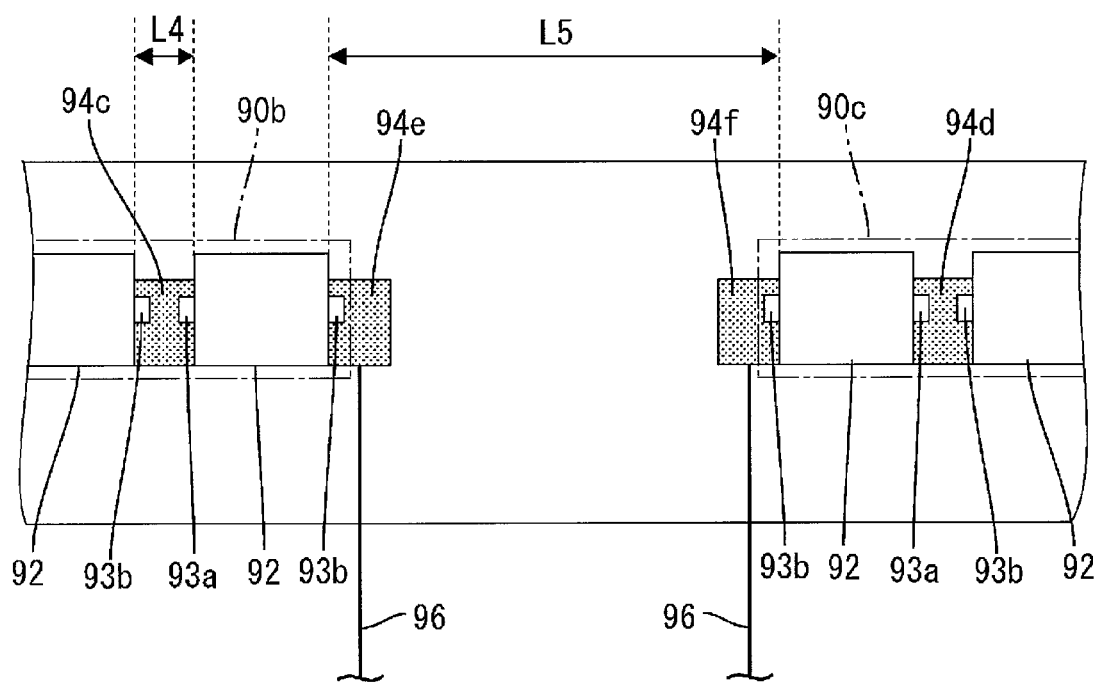
FIG. 10 is an enlarged typical view illustrating a configuration between the second light source array and a third light source array according to the comparative example.

FIG. 7 is an enlarged typical view illustrating a configuration of a border part between the first light source array and the second light source array. FIG. 8 is an enlarged typical view illustrating a configuration of a border part between the second light source array and the third light source array. FIGS. 9 and 10 illustrate a configuration in which the LED light sources are connected in series as a comparative example.

In the backlight device 12 according to the present embodiment, as illustrated in FIG. 7, the adjacent first light source array 40a and second light source array 40b are opposed to each other and the LED light source 32 of the first light source array 40a is opposed to the LED light source 32 of the second light source array 40b so that the corresponding anodes 33a, 33a are opposed to each other. The anodes 33a, 33a are connected to the first conductive pattern 34a that is arranged between the first light source array 40a and the second light source array 40b. Therefore, one power supply harness 35 that is connected to the first conductive pattern 34a enables to supply the driving power to the first light source array 40a and the second light source array 40b.

A first light source array 90a and a second light source array 90b of a comparative example illustrated in FIG. 9 will be explained. In the first light source array 90a and the second light source array 90b of the comparative example, all the LED light sources 92 are connected in series and the opposing electrodes (anode 93a and cathode 93b) have different polarities. In such a case, two conductive patterns 94a, 94b each of which is connected to the corresponding light source array 90a, 90b are necessary to be arranged between the first light source array 90a and the second light source array 90b. Also, a separate power supply harness 95 is required to be connected to each of the conductive patterns 94a, 94b. If two power supply harnesses 95, 95 are arranged in parallel with each other, a predetermined distance is required between the power supply harnesses 95, 95 from a safety standpoint. Therefore, a distance is required between the first light source array 90a and the second light source array 90b. This makes the distance L3 between the opposing LED light sources 92, 92 of the first light source array 90a and the second light source array 90b greater than the distance L4 between another LED light sources 92, 92.

However, according to the present embodiment, one power supply harness 35 supplies driving power to the first light source array 40a and the second light source array 40b via the first conductive pattern 34a. Therefore, as illustrated in FIG. 7, a space is not required between the light source arrays 40a, 40b. This enables the distance L1 between the opposing LED light sources 32, 32 of the light source arrays 40a, 40b to be same as the distance L3 between another LED light sources 32, 32. This enables the LED light sources 32 to be arranged closely at equal intervals. This also increases the amount of light from the backlight device 12 and makes the illumination brightness distribution uniform.

According to the present embodiment, as illustrated in FIG. 8, in the light source unit 41 (indicated by the number in FIG. 8) that is positioned close to the side of the second light source array 40b that is not opposed to the adjacent first light source array 40a (in FIG. 8, the side of the second light source array 40b opposing to the third light source array 40c), two LED light sources 32, 32 are arranged so that the cathodes 33b, 33b are opposed to each other. The opposing cathodes 33b, 33b are connected to the second conductive pattern 34b and the grounding harness 36 is connected to the second conductive pattern 34b. Therefore, the grounding harness 36 is not arranged on the side end of the second light source array 40b (and the third light source array 40c) but on a portion of the second light source array 40b far from its side end by one LED light source 32 positioned at the end of the second light source array 40b.

The second light source array 90b and a third light source array 90c according to the comparative example will be explained with reference to FIG. 10. Each of the second light source array 90b and the third light source array 90c of the comparative example is arranged so that the electrodes of the two LED light sources 92, 92 having different polarities (the cathode 93b and the anode 93a) are opposed to each other. In such a case, since the electrodes having different polarities are connected to each conductive pattern 94c, 94d between the LED light sources 92, 92, the grounding harness 96 is not able to be connected to the conductive patterns 94c, 94d. Therefore, conductive patterns 94e, 94f are provided on the corresponding light source arrays 90b, 90c so as to be opposed to each other and the grounding harnesses 96, 96 are connected to the conductive patterns 94e, 94f. The grounding harnesses 96, 96 are provided at the outermost ends of the second light source array 90b and the third light source array 90c. Therefore, a space is required between the second light source array 90b and the third light source array 90c so that the grounding harnesses 96, 96 do not get close to each other. This makes the distance L5 between the opposing LED light sources 92, 92 of the light source arrays 90b, 90c to be greater than the distance L4 between another LED light sources 92, 92.

However, according to the present embodiment, as illustrated in FIG. 8, the grounding harness 36 is not provided at the outermost end of the second light source array 40b and the third light source array 40c but on a portion of the light source array far from its side end by one LED light source 32. Therefore, a predetermined distance is formed between the connected grounding harnesses 36, 36 and the second light source array 40b and the third light source array 40c respectively. Another space is not required between the second light array 40b and the third light source array 40c. This enables the distance L1 between the opposing LED light sources 32, 32 of the light source arrays 40b, 40c to be same as the distance L2 between another LED light sources 32, 32.

In the present embodiment, the light source array 40 includes the light source unit 41 including two LED light sources 32, 32 that are connected in parallel and the light source units 41 are connected in series.

With such a configuration, in each light source unit 41, it is not required to consider variation of the light emission amount in the LED light sources 32 that are connected in parallel. Therefore, the variation of the light emission amount of the present embodiment is substantially same as that obtained when a predetermined number of LED light sources 92 are connected in series, and the increased number of LED light sources 32 are connected and arranged closely. Since the light source units 41 are connected in series, the illumination brightness of the backlight device 12 is suppressed from being lowered.

In the present embodiment, each light source array 40 is comprised of a predetermined number of LED light sources 32 that are arranged along a straight line. The adjacent light source arrays 40a, 40b are arranged along a line that aligns along the arrangement line of the LED light sources 32.

With such a configuration, all the LED light sources 32 are arranged along a straight line and linear light is obtained. In such a case, with the connection configuration of the LED light sources 32 according to the present embodiment, the LED light sources 32 are arranged closely at equal intervals. Accordingly, a uniform linear light is obtained.

The backlight device 12 of the present embodiment is configured to use an edge-light type in which the LED light sources 32 are arranged on the rim of the chassis 14.

In the edge-light type backlight device 12, the LED light sources 32 are arranged in a narrow space at the side of the chassis 14. Therefore, it is desirable to arrange the LED light sources 32 closely to obtain high illumination brightness. Therefore, by applying the connection configuration of the LED light sources 32 of the present embodiment to the edge-light type backlight device 12, the LED light sources 32 are arranged closely to obtain illumination light having high brightness.

Second Embodiment

Next, a second embodiment of the present invention will be explained with reference to FIGS. 11 and 12. The connection configuration of the LED light sources is changed from the first embodiment, and other configurations are same as the first embodiment. The same parts as the first embodiment are indicated by the same symbols and will not be explained.

Figure 11:
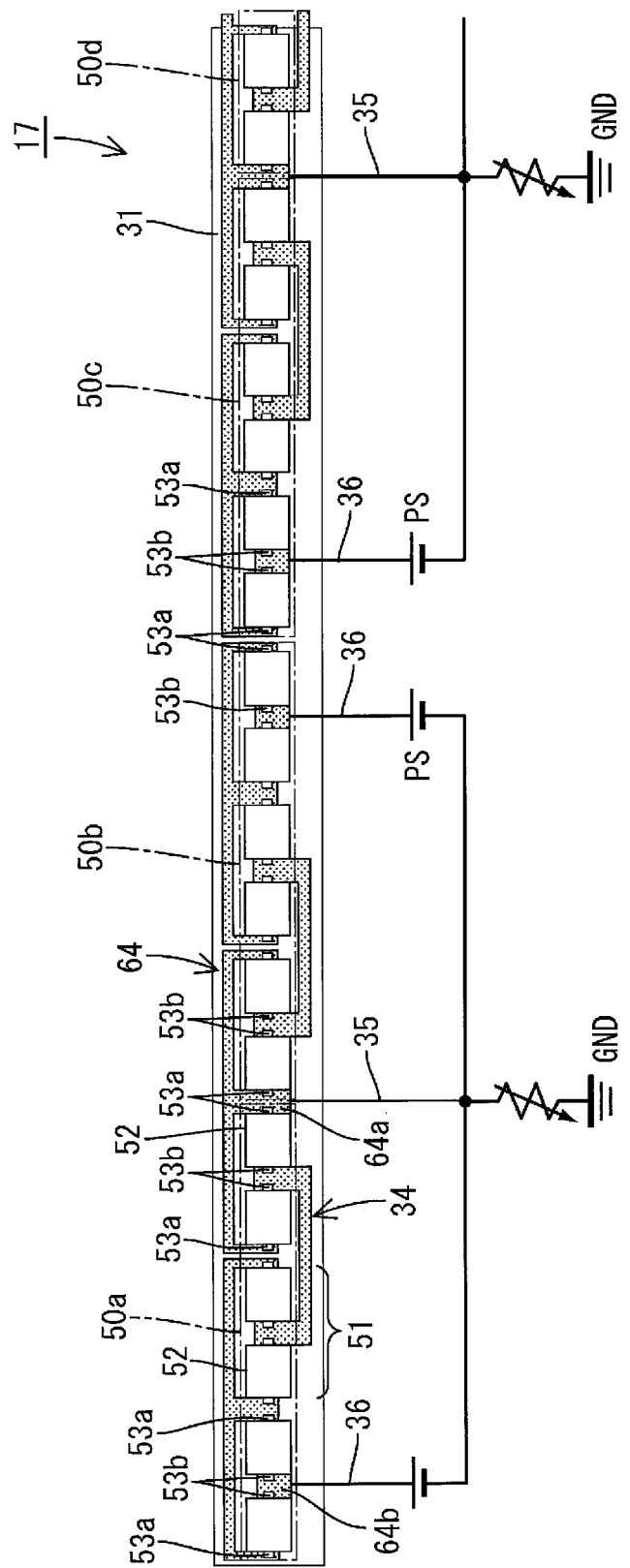
FIG. 11 is a typical view illustrating a connection configuration of LED light sources on an LED board and conductive patterns according to a second embodiment of the present invention.

FIG. 11 is a typical view illustrating a connection configuration of the LED light sources and the conductive pattern according to the second embodiment. FIG. 12 is a circuit diagram illustrating a driving configuration of the LED light sources.

As illustrated in FIG. 11, six LED light sources 52 comprise each of a first light source array 50a, a second light source array 50b, a third light source array 50c, a fourth light source array 50d . . . . The driving configuration of the LED light source 52 will be explained for the first light source array 50a as an example.

At the left end side of the first light source array 50a, two LED light sources 52, 52 are arranged so that the corresponding anodes 53b, 53b are opposed to each other. The anodes 53b, 53b are connected to the conductive pattern 64 (first conductive pattern 64b) that is formed therebetween. The power supply harness 36 extending from the power source PS is connected to the first conductive pattern 64b. The driving power is supplied to the left-side two LED light sources 52, 52.

The cathode 53a of the LED light source 52 that is located at the right end of the first light source array 50a (so as to be opposed to the second light source array 50b) is connected to the conductive pattern 64 (second conductive pattern 64a). The grounding harness 35 is connected to the second conductive pattern 64a and the driving power flowing in the first light source array 50a is discharged to the ground GND.

Figure 12:
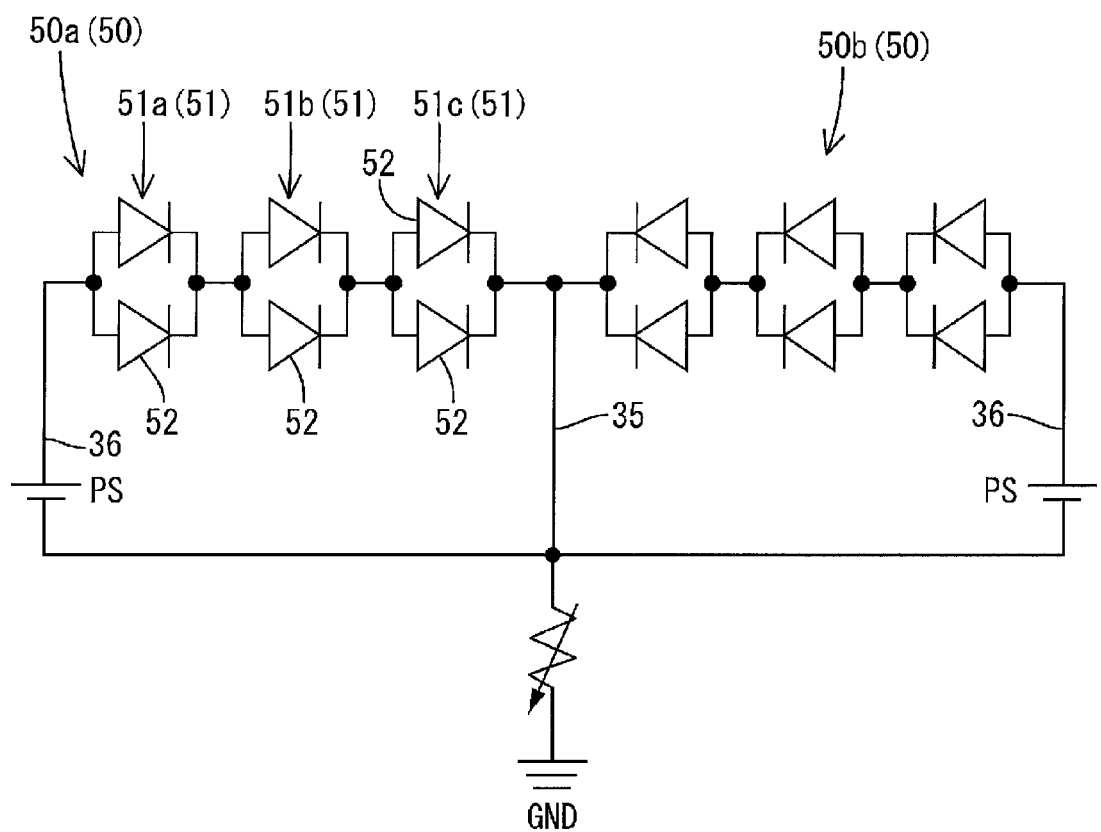
FIG. 12 is a circuit diagram illustrating a driving configuration of the LED light sources in FIG. 11.

Two adjacent LED light sources 52, 52 of the first light source array 50a are connected in parallel to form the light source unit 51 as illustrated in FIG. 12. Further, the light source units 51 are connected in series. Therefore, power supplied from the power supply harness 36 to the first light source array 50a is supplied to a first light source unit 51a, a second light source unit 51b, a third light source unit 51c in this order and discharged from the grounding harness 35.

The second light source array 50b adjacent to the first light source array 50a has a configuration that is mirror symmetrical about the first light source array 50a. Therefore, the LED light sources 52 of the first light source array 50a and the second light source array 50b that are opposed to each other are arranged so that the corresponding cathodes 53a, 53a are opposed to each other. The third light source array 50c adjacent to the second light source array 50b has a configuration that is mirror symmetrical about the second light source array 50b (the third light source array 50c has the same configuration as the first light source array 50a).

In the second embodiment, the first array 50a and the second array 50b are configured so that the cathodes 53a, 53a are arranged to opposed to each other. The cathodes 53a, 53a are connected to the second conductive pattern 64a. Therefore, one grounding harness 35 enables to discharge driving power from the first array 50a and the second array 50b. Accordingly, a space is not required between the light source arrays 50a, 50b and this enables the LED light sources 52 to be arranged at equal intervals.

According to the present embodiment, in the light source unit 51 that is positioned close to the side of the second light source array 50b that is not opposed to the adjacent first light source array 50a (the side of the second light source array 50b opposing to the third light source array 50c here), two LED light sources 52, 52 are arranged so that the anodes 53b, 53b are opposed to each other. The opposing anodes 53b, 53b are connected to the first conductive pattern 64b and the power supply harness 36 is connected to the first conductive pattern 64b. Therefore, the power supply harness 36 is not arranged on the outermost side end of the second light source array 50b (and the third light source array 50c) but on a portion of the second light source array 50b far from its side end by one LED light source 52 positioned at the end of the second light source array 50b. Therefore, a predetermined distance is formed between the power supply harnesses 36, 36 that are connected to the second light source array 50b and the third light source array 50c respectively. Another space is not required between the second light array 50b and the third light source array 50c. This enables the LED light sources 52 to be arranged at equal intervals.

Other Embodiments

The embodiments of the present invention have been described, however, the present invention is not limited to the above embodiments explained in the above description and the drawings. The following embodiments may be included in the technical scope of the present invention, for example.

(1) In the above embodiments, two LED light sources are connected in parallel to form the light source unit. However, three or more LED power sources may be connected in parallel.

(2) In the above embodiments, the LED light sources forming one light source array are arranged along a straight line as a whole and the light source arrays are arranged along a line so that the LED light sources are arranged along a straight line as a whole. However, for example, the LED light sources may be arranged in a zigzag alignment or along a plurality of lines.

(3) In the above embodiments, the surface-mount type LED light sources that emit white light are used. However, the LED light sources are not limited thereto. For example, LED light sources may be obtained by fixing by resin three LED chips each of which emits single color light of red, green and blue respectively.

The invention claimed is:

1. A lighting device comprising:
a plurality of point light sources; and
conductive patterns electrically connected to the point light sources, wherein:
each of the point light sources includes two electrodes having different polarities, and the point light sources are defined in a plurality of light source arrays each including a predetermined number of point light sources, and driving power is supplied to each light source array; and
the adjacent light source arrays are arranged such that one of the electrodes of the point light source in one of the adjacent light source arrays is opposed to one of the electrodes of the point light source in another one of the adjacent light source arrays;
the point light sources are arranged such that the opposed electrodes have a same polarity; and
the opposed electrodes are connected to same one of the conductive patterns.

2. The lighting device according to claim 1, wherein:
the light source array includes light source units each including a plurality of point light sources that are connected in parallel; and
the light source units are connected in series.

3. The lighting device according to claim 2, wherein:
the light source unit includes two point light sources; and
the two point light sources in the light source unit located at a side far from an opposing side of the adjacent light source arrays are arranged such that each one of the electrodes is opposed to each other, and the opposed electrodes have a same polarity and are connected to same one of the conductive patterns.

4. The lighting device according to claim 1, wherein:
the light source array includes a predetermined number of point light sources that are arranged along a straight line; and
the adjacent light source arrays are arranged along a line so as to align along an arrangement direction of the point light sources.

5. The lighting device according to claim 1, further comprising a chassis housing the point light sources, wherein the point light sources are arranged along a side of the chassis to provide an edge-light type lighting device.

6. A display device comprising:
the lighting device according to claim 1; and
a display panel provided in front of the lighting device.

7. The display device according to claim 6, wherein the display panel is a liquid crystal display panel including liquid crystals enclosed between a pair of substrates.

8. A television receiver comprising the display device according to claim 6.

* * * * *